United States Patent [19]
Horejs, Jr. et al.

[11] Patent Number: 6,058,017
[45] Date of Patent: May 2, 2000

[54] PLASTIC INTEGRATED CIRCUIT CARD WITH AN ENCLOSED REINFORCEMENT STRUCTURE SEPARATED FROM AN INTEGRATED CIRCUIT MODULE FOR PROTECTING THE INTEGRATED CIRCUIT MODULE

[75] Inventors: Charles F. Horejs, Jr., Morgan Hill; Thomas H. Templeton, Jr., Fremont, both of Calif.

[73] Assignee: US³, Inc., Santa Clara, Calif.

[21] Appl. No.: 08/688,074

[22] Filed: Jul. 29, 1996

Related U.S. Application Data

[62] Division of application No. 08/197,022, Feb. 14, 1994.

[51] Int. Cl.[7] ....................................................... H05K 1/18
[52] U.S. Cl. ............................................. 361/737; 361/761
[58] Field of Search ................................... 361/737, 684, 361/761, 729; H05K 1/18

[56] References Cited

U.S. PATENT DOCUMENTS

| | | | |
|---|---|---|---|
| 4,463,971 | 8/1984 | Hoppe et al. | 235/492 X |
| 4,764,803 | 8/1988 | Ueda | 257/679 |
| 4,804,828 | 2/1989 | Oogita | 235/1 D |
| 4,825,283 | 4/1989 | Shino | 257/679 |
| 4,841,134 | 6/1989 | Hida et al. | 235/492 X |
| 4,961,105 | 10/1990 | Yamamoto | 174/52.4 X |
| 4,962,415 | 10/1990 | Yamamoto et al. | 235/492 X |
| 4,994,659 | 2/1991 | Yabe et al. | 235/492 |
| 5,041,395 | 8/1991 | Steffen | 437/206 |
| 5,214,566 | 5/1993 | Dupre et al. | 361/737 X |
| 5,264,990 | 11/1993 | Venambre | 361/761 |
| 5,321,240 | 6/1994 | Takahira | 235/492 X |
| 5,585,669 | 12/1996 | Venambre | 257/679 |

FOREIGN PATENT DOCUMENTS 2279612  1/1995  United Kingdom .

*Primary Examiner*—Lynn D. Feild
*Attorney, Agent, or Firm*—Skjerven, Morrill, MacPherson, Franklin & Friel; David W. Heid

[57] ABSTRACT

A reinforcement structure to protect an integrated circuit module located within a smart card. The integrated circuit module is disposed in the smart card. The reinforcement structure, which has a modulus of elasticity higher than the modulus of elasticity of the smart card, is completely surrounded by the smart card and separated from the integrated circuit module. The integrated circuit module can also be completely surrounded by the smart card. In addition, the smart card can have a plurality of layers, with the integrated circuit module and/or the reinforcement structure extending into one or more of the card layers. The reinforcement structure relieves stress on the integrated circuit module during bending and torsion of the card.

13 Claims, 14 Drawing Sheets

PLASTIC INTEGRATED CIRCUIT CARD WITH AN ENCLOSED REINFORCEMENT STRUCTURE SEPARATED FROM AN INTEGRATED CIRCUIT MODULE FOR PROTECTING THE INTEGRATED CIRCUIT MODULE

This application is a division of application Ser. No. 08/197,022, filed Feb. 14, 1994.

FIELD OF THE INVENTION

The present invention relates to protection of an integrated circuit module.

BACKGROUND OF THE INVENTION

There are a wide variety of applications that can make use of a flexible structure including electronic and/or electromagnetic devices, the devices being used for information input and output to and from the flexible structure, information processing and information storage. One example of such a flexible structure is a flexible identification card.

An identification card, as defined by the International Standards Organization (ISO) in ISO 7810, is "[a] card identifying its bearer and issuer which may carry data required as input for the intended use of the card and for transactions based thereon." Identification cards can have one of three nominal sizes (as specified in ISO 7810): 1) 3.370 inch (85.60 mm) width, 2.125 inch (53.98 mm) height, 0.030 inch (0.76 mm) thickness; 2) 4.134 inch (105 mm) width, 2.913 inch (74 mm) height, 0.030 inch (0.76 mm) thickness; 3) 4.921 inch (125 mm) width, 3.465 inch (88 mm) height, 0.030 inch (0.76 mm) thickness.

Some identification cards include an integrated circuit and are known as "integrated circuit cards" or "smart cards." More generally, herein, "smart card" refers to any portable card-like device which includes one or more electronic components, i.e., active components such as integrated circuits, transistors and diodes, and passive components such as resistors, capacitors and inductors. The integrated circuits can be formed on an integrated circuit chip and/or printed circuit board that is, in turn, attached to the main body of the smart card. Smart cards can be used for a wide variety of applications such as prepaid "debit" cards (e.g., phone cards, transit passes, electronic purse), subscriber cards (e.g., bank ATM cards, credit cards, point-of-sale cards), loyalty scheme cards (e.g., frequent flier cards), security access and identification cards, health insurance and service cards (with optional protected memory), GSM (global system management for European Cellular Phones) cards and encryption/decryption cards.

Smart cards are used with a reader/writer that includes an interface ("external interface") that is used to transmit information to or from the smart card. Some smart cards include electrical contacts which are used to make electrical connection between electrical circuitry on or within the smart card and the external interface i.e., contact-type smart cards. Other smart cards do not include electrical contacts and accomplish the transfer of information to and from the smart card through another means such as, for example, an inductive coil formed in or on the smart card that is used in combination with an external interface that produces and responds to an electromagnetic field, i.e., electromagnetic contact-less smart cards. Other types of contact-less cards use electro-static or capacitive coupling to accomplish the transfer of data and instructions to and from the card.

ISO 7816-1 sets forth the standards for bending and torsion which must be met by integrated circuit cards.

The standard provides:
A.1 Bending properties
  A.1.1 Procedure
    Place the card between the two jaws of a machine, one of them being a moving part and bend
      a) the long side:
        deflection (f): 2 cm;
        periodicity: 30 bendings per minute;
      b) the short side:
        deflection (f): 1 cm;
        periodicity: 30 bendings per minute;
    Check the functioning of the card in the writing or reading mode every 125 bendings. Recommended test duration: at least 250 passes in each of the four test orientations.
  A.1.2 Criteria for Acceptability
    The card shall still function and shall not show any cracked part after 1,000 bendings.
A.2 Torsion properties
  A.2.1 Procedure
    Place the card in a machine which applies torsion to its short sides, the maximum displacement being through 15°±1° in alternate directions at a rate of 30 torsions per minute. Check the correct functioning of the card in the writing and/or reading mode (as appropriate) every 125 torsions.
  A.2.2 Criteria for Acceptability
    The card shall still function and shall not show any cracked part after 1,000 torsions.

Accordingly, it is desirable to have a integrated circuit card which is able to meet the bending and torsion requirements of this standard.

SUMMARY OF THE INVENTION

Accordingly, a card having a reinforcement structure disposed within one or more layers of the card is provided. The reinforcement structure has a higher modulus of elasticity (it is stiffer) than the card. A module containing an electronic component is also disposed within one or more layers of the card. The reinforcement structure relieves stress which would otherwise be experienced by the module during bending and torsion of either contact-type or contact-less cards.

This invention will be more fully understood in light of the following drawings taken together with the detailed description.

DETAILED DESCRIPTION

Figure 1:
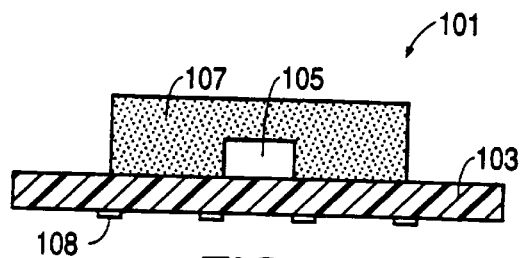
FIG. 1 is a cross section of a typical integrated circuit module which is located within a card.

FIG. 1 illustrates a cross section of a typical integrated circuit module 101 which is located within a card of the present invention. Module 101 includes a substrate 103, an electronic component 105, and an encapsulant 107. Electrical contacts, such as electrical contact 108 (shown in enlarged detail), are formed on the underside of substrate 103 to provide access to an external interface for a contact type card. Module 101 must be protected during bending or torsion of the card in which the module is located. Inadequate protection may result in damage to the integrated circuit module 101 which may further result in failure of the card.

Figure 2:
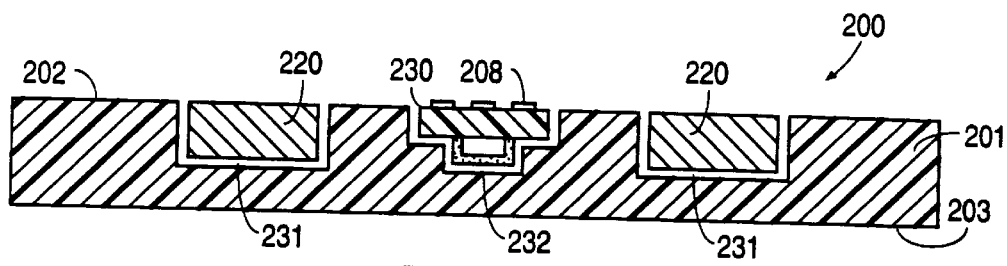
FIG. 2 is a cross section of a single layer, contact-type card having a washer-type reinforcement structure.

FIG. 2 is a cross section of a single layer contact-type card in accordance with the present invention. The card 200 is constructed of a single layer 201 having an upper surface 202 and a lower surface 203. Layer 201 may be made of a material including plastics such as polyester, polyvinyl chloride (PVC), polycarbonate, polyethelynetelephthalate (PET) and polysulfone. First opening 231 and second opening 232 are formed in the upper surface 202 of layer 201. Reinforcement structure 220 is affixed in first opening 231 using an adhesive such as an acrylic adhesive, a thermal set adhesive, or any other suitable adhesive. In an alternate embodiment, a molding compound, such as a molding epoxy or a polyphenylene sulfide molding compound, in liquid form, is placed in first opening 231. The molding compound is then cured to form solid reinforcement structure 220. Integrated circuit module 230 is similarly affixed in second opening 232. Contacts, such as contact 208 on the surface of the module 230, are exposed at the upper surface 202 of layer 201. First and second openings 231–232 are formed by punching, milling, machining or etching layer 201. First and second openings 231–232 do not extend completely through layer 201 and are dimensioned to closely receive reinforcement structure 220 and module 230, respectively. Various materials may be used to make reinforcement structure 220 in accordance with the present invention. Acceptable materials include plastics such as polyester, PVC, polycarbonate, PET and polysulfone, metals, fabrics, and graphite composite materials. The material used for the reinforcement structure 220 preferably has a higher modulus of elasticity than the material for layer 201. It is understood that, (1) the reinforcement structures and modules shown in FIGS. 2–36 are enlarged with respect to the layer(s) of the cards to better illustrate these elements and (2) the gaps shown between the reinforcement structures, the modules and the card layer(s) are similarly enlarged.

Figure 3:
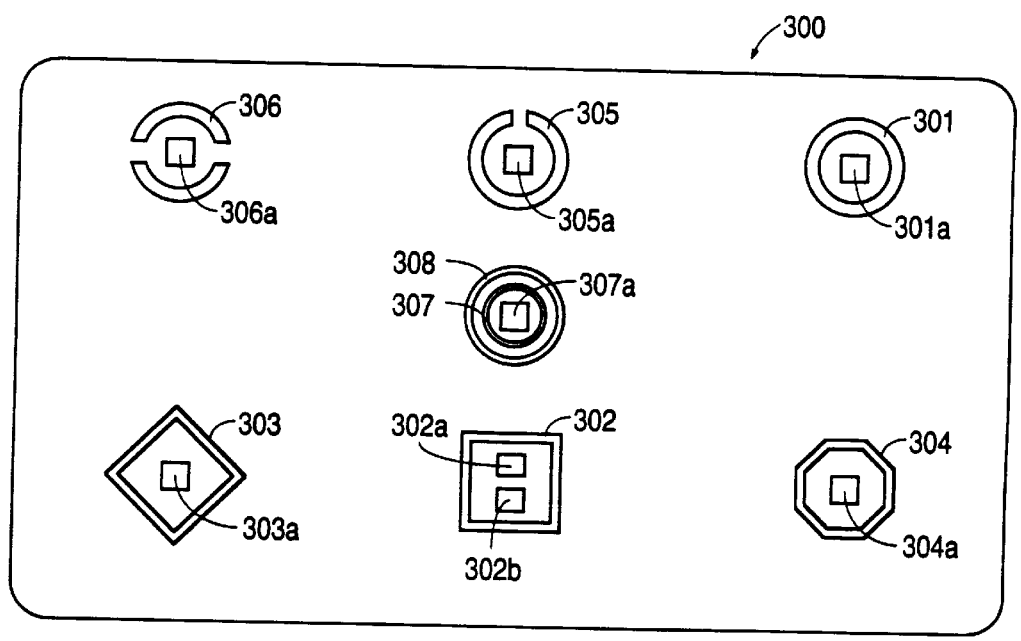
FIG. 3 is a top view of various washer-type reinforcement structures positioned on a card.

Reinforcement structure 220 is a washer-type reinforcement structure. That is, the reinforcement structure substantially laterally surrounds the module 230. FIG. 3 is a top view of various washer-type reinforcement structures in accordance with the present invention. Circular reinforcement structure 301, square reinforcement structure 302, rhombic reinforcement structure 303 and octagonal reinforcement structure 304 protect modules 301a, 302a–302b, 303a and 304a, respectively, on card 300. Any polygonal or round (including an oval shape) shape may be used for a washer-type reinforcement structure. A washer-type reinforcement structure may also consist of a "broken" shape as shown by the "broken" circular reinforcement structure 305, which protects module 305a. A washer-type reinforcement structure may also consist of more than one piece as shown by reinforcement structure 306 which protects module 306a. A washer type reinforcement structure may also consist of concentric reinforcement structures as shown by reinforcement structures 307 and 308. These reinforcement structures provide increased protection for module 307a by further stiffening the area of the card surrounding module 307a. More than two concentric reinforcement structures may be used to form a reinforcement structure. In fact, a washer-type reinforcement structure can be virtually any size, shape or geometry as long as it substantially laterally surrounds the module which it is protecting. FIG. 3 also illustrates several other aspects of the present invention. First, certain embodiments of the present invention utilize more than one reinforcement structure and/or module on a single card. In addition, a reinforcement structure/module pair may be located at various positions within the card. Furthermore, more than one module may be disposed within a single reinforcement structure.

Figure 4:
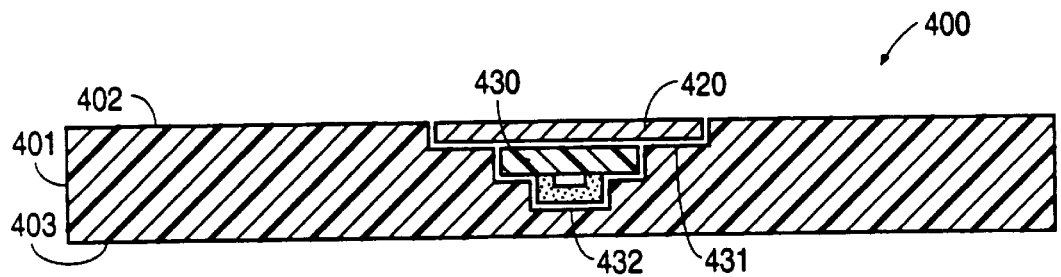
FIG. 4 is a cross section of a single layer contact-less card having a plate-type reinforcement structure.
Figure 5:
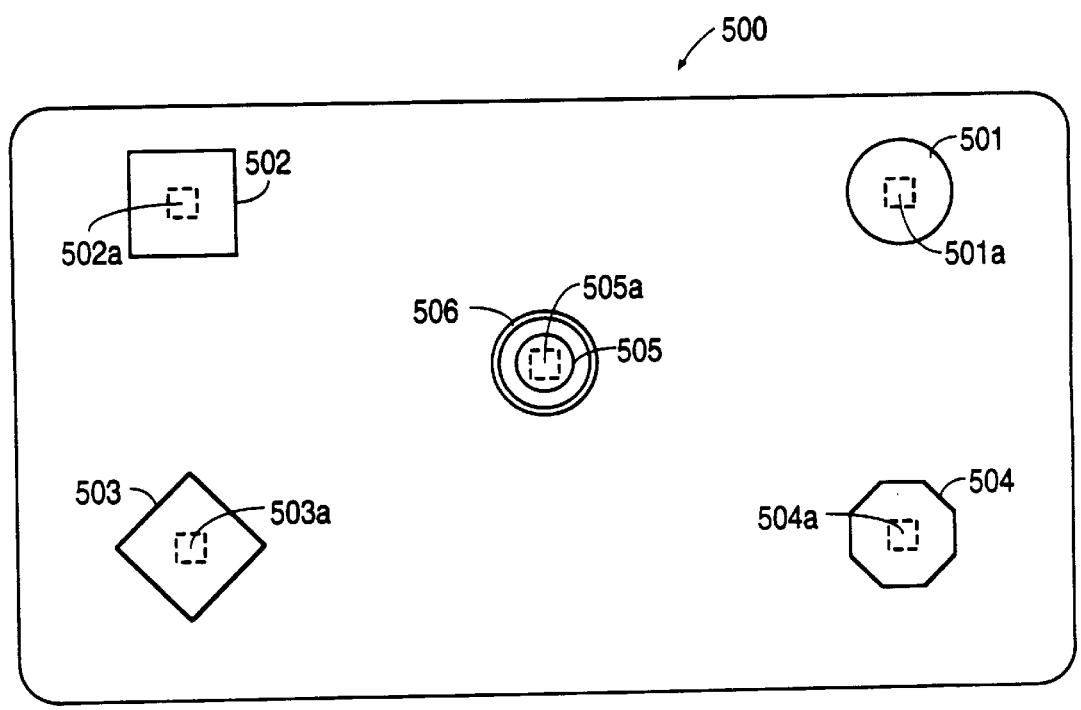
FIG. 5 is a top view of various plate-type reinforcement structures positioned on a card.

FIG. 4 is a cross section of a reinforcement structure for a single layer contact-less card. In this embodiment, the reinforcement structure 420 is a plate-type reinforcement structure disposed into first opening 431 in upper surface 402 of layer 401. Module 430 is disposed into second opening 432. The plate-type reinforcement structure is substantially planar. FIG. 5 is a top view of various plate-type reinforcement structures in accordance with the present invention. Circular reinforcement structure 501, square reinforcement structure 502, rhombic reinforcement structure 503 and octagonal reinforcement structure 504 protect underlying modules 501a, 502a–502b, 503a and 504a, respectively, on card 500. Any polygonal or round shape may be used for a plate-type reinforcement structure. A plate-type reinforcement structure, such as reinforcement structure 505, can be combined with a washer-type reinforcement structure, such as reinforcement structure 506 to protect a module such as module 505a.

Figure 6:
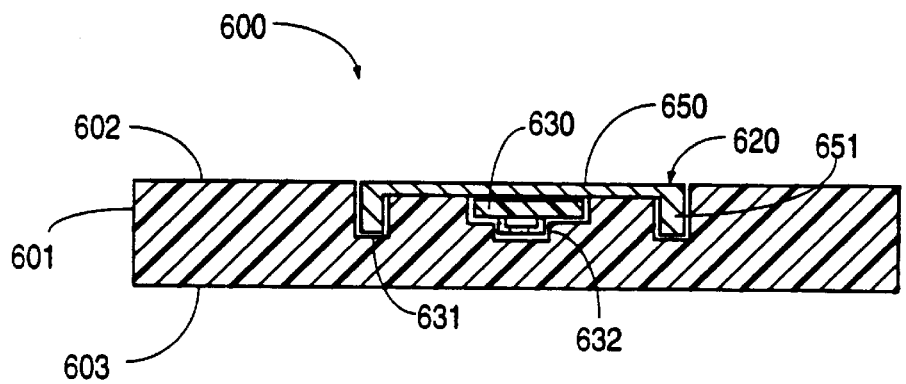
FIG. 6 is a cross section of a single layer contact-less card having a cap-type reinforcement structure.
Figures 7A, 7B:
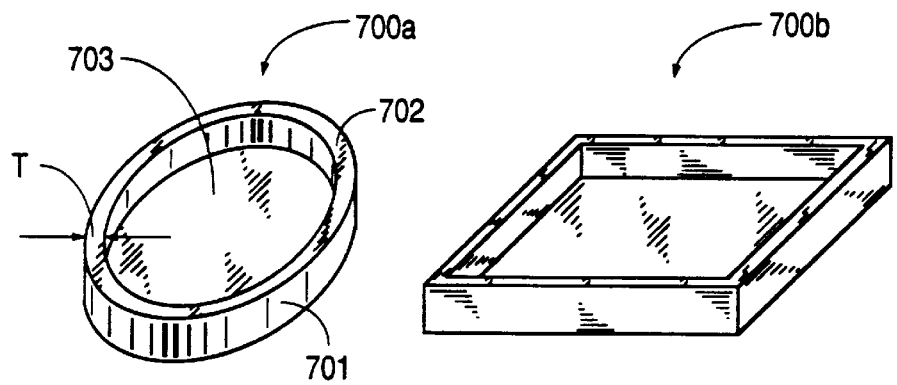
FIGS. 7a–d are isometric views of various cap-type reinforcement structures.
Figures 7C, 7D:
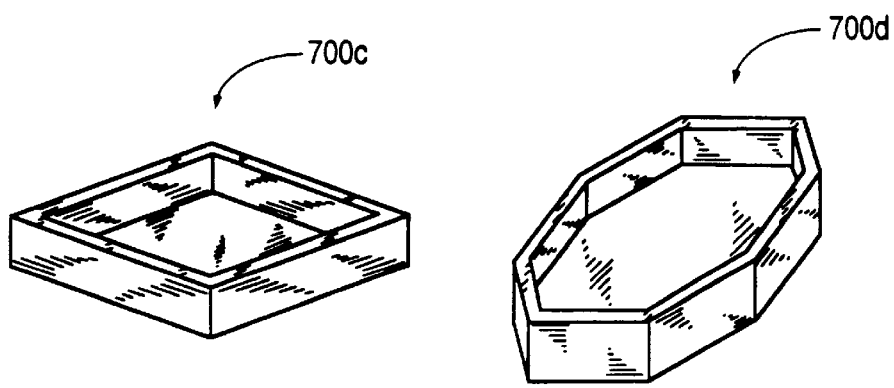

FIG. 6 is a cross section of a reinforcement structure for a single layer contact-less card. In this embodiment, the reinforcement structure 620 is a cap-type reinforcement structure. The cap-type reinforcement structure has a substantially planar portion 650 like the plate-type reinforcement structure, plus a flange 651 (or flanges) which extend into first opening 631 in the upper surface 602 of layer 601. Module 630 is disposed into second opening 632 in upper surface 602. FIGS. 7a–d are isometric views of various cap-type reinforcement structures in accordance with the present invention. FIGS. 7a–d illustrate circular reinforcement structure 700a, square reinforcement structure 700b, rhombic (or diamond-shaped) reinforcement structure 700c and octagonal reinforcement structure 700d, respectively. Referring to FIG. 7a, it will be noted that reinforcement structure 700a includes wall 701 which terminates at edge 702 and surface 703. The thickness of well 701 is indicated by T between the arrows. Reinforcement structures 700b–700d, although shaped differently, each have a wall which terminates at an edge and a surface, upper and lower edges providing a cap-type structure. Any polygonal or round shape may be used as the substantially planar portion of a cap-type reinforcement structure.

Figure 8:
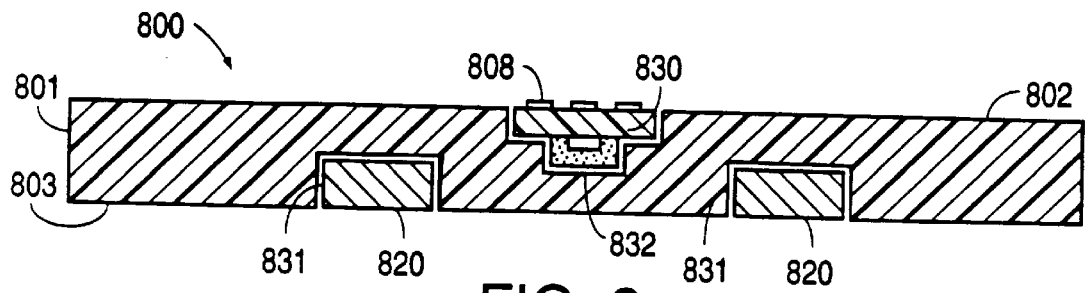
FIG. 8 is a cross section of a single layer contact-type card having a washer-type reinforcement structure.
Figure 9:
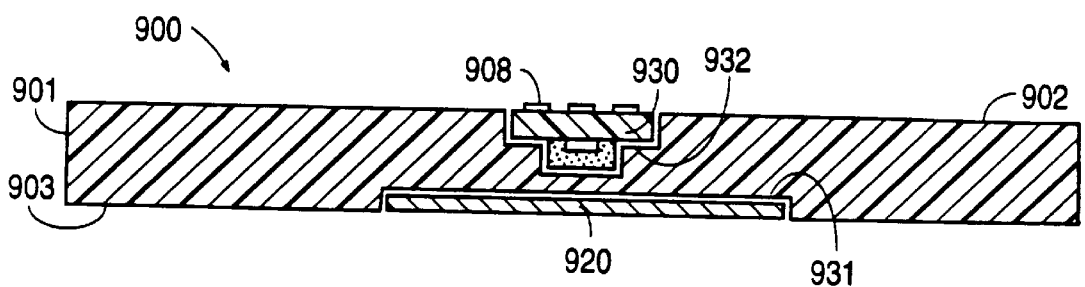
FIG. 9 is a cross section of a single layer contact-type card having a plate-type reinforcement structure.
Figure 10:
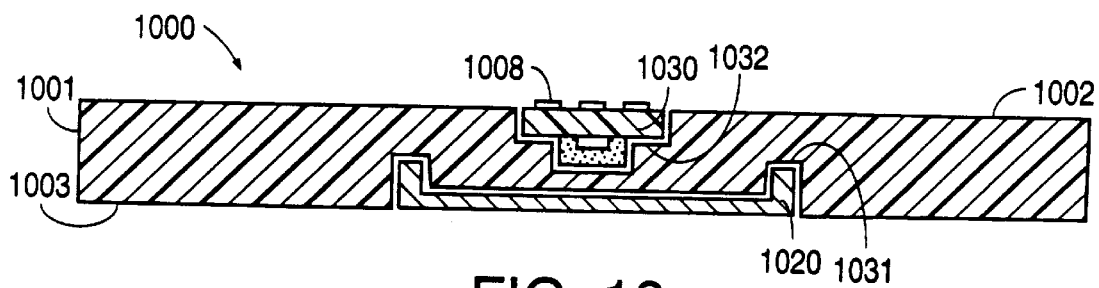
FIG. 10 is a cross section of a single layer contact-type card having a cap-type reinforcement structure.

Although the embodiments of FIGS. 4 and 6 show plate-type and cap-type reinforcement structures in contact-less embodiments, these reinforcement structures can also be used in single layer contact type embodiments as shown in FIGS. 8–10. In FIG. 8, a first opening 831 is formed in the lower surface 803 of layer 801 (of card 800). Washer-type reinforcement structure 820 is affixed within first opening 831. Module 830 is affixed in second opening 832 in upper surface 802 of layer 801. Contacts, such as contact 808, are exposed at the upper surface 802 of layer 801.

Similarly, in FIG. 9, washer-type reinforcement structure 920 is affixed in a first opening 931 formed in the lower surface 903 of layer 901 (of card 900). Module 930 is affixed in second opening 932 in upper surface 902 of layer 901. Contacts, such as contact 908, are exposed at the upper surface 902 of layer 901.

In FIG. 10, cap-type reinforcement structure 1020 is affixed in a first opening 1031 in the lower surface 1003 of layer 1001 (of card 1000). Module 1030 is affixed in second opening 1032 in the upper surface 1002 of layer 1001. Contacts, such as contact 1008, are exposed at the upper surface 1002 of layer 1001.

Figure 11:
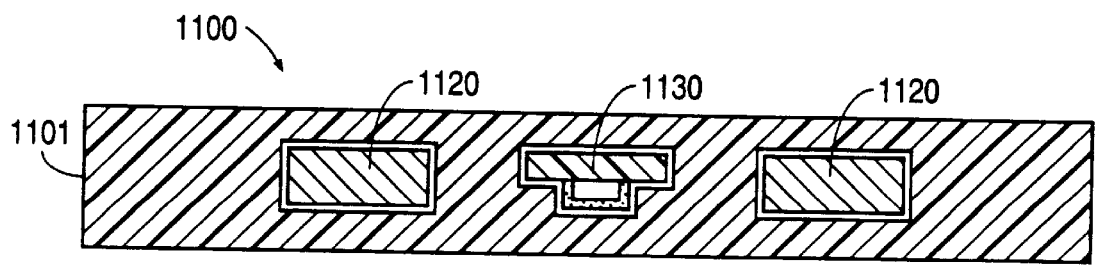
FIG. 11 is a cross section of a molded contact-less card having a washer-type reinforcement structure.

FIG. 11 is a cross section of a molded contact-less type of card in accordance with the present invention. The card 1100 is constructed of a single molded layer 1101 which encloses the reinforcement structure 1120 and the module 1130. As in the other embodiments, the reinforcement structure 1120 has a higher modulus of elasticity than the molded layer 1101. The reinforcement structure of this embodiment is not limited to washer-type reinforcement structure 1120, but also includes plate-type and cap-type reinforcement structures.

In alternate embodiments of the present invention, the card containing the module and reinforcement structure is laminated. FIGS. 12–17 illustrate two-layer embodiments which may be used for contact-less cards.

Figure 12:
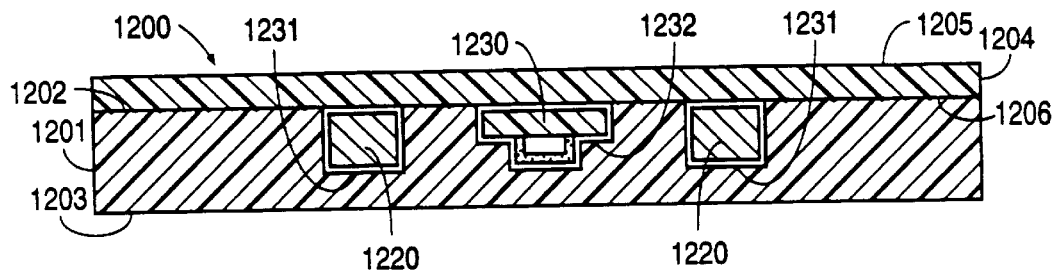
FIGS. 12–17 are cross sections of different embodiments of two layer contact-less cards, each card having a reinforcement structure.

FIG. 12 is cross section of a contact-less card 1200 in accordance with the present invention. As shown in FIG. 12, a reinforcement structure 1220, is affixed in first opening 1231 in the upper surface 1202 of first layer 1201. Module 1230 is similarly affixed in second opening 1232 in the upper surface 1202. Lower surface 1206 of second layer 1204 is affixed to the upper surface 1202 of first layer 1201 to form a laminated structure. This affixing may be performed using various methods including but not limited to a heat activated adhesive, a contact adhesive, thermal fusing, ultrasonic welding or an epoxy adhesive. The reinforcement structure of this embodiment is not limited to washer-type reinforcement structure 1220, but also includes plate-type and cap-type reinforcement structures.

Figure 13:
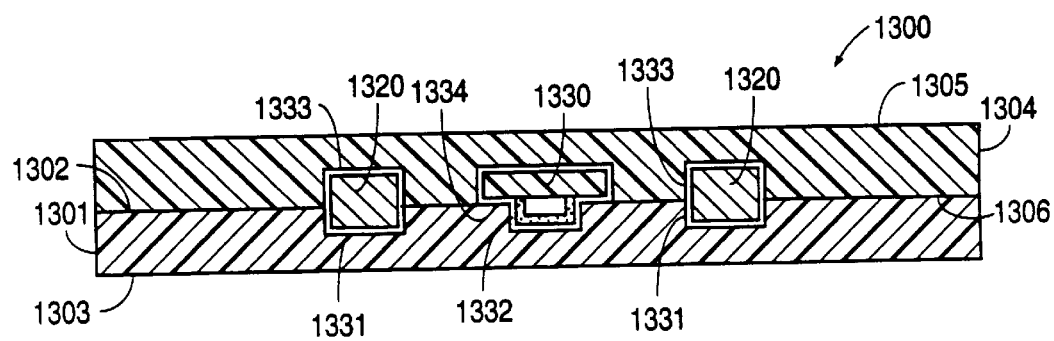

FIG. 13 illustrates a cross section of a reinforcement structure which extends through multiple layers of contact-less card 1300. Reinforcement structure 1320 is disposed in a first opening 1331 in upper surface 1302 of first layer 1301. Nodule 1330 is disposed in a second opening 1332 in upper surface of first layer 1301. Reinforcement structure 1320 is also disposed in a third opening 1333 in lower surface 1306 of second layer 1304. Module 1330 is also disposed in a fourth opening 1334 in lower surface 1306 of second layer 1304. The upper surface 1302 and lower surface 1306 are then affixed to one another using one of the methods previously described. First opening 1331, second opening 1332, third opening 1333 and fourth opening 1334 are created in first and second layers 1301, 1304, with proper alignment, prior to assembly.

Figure 14:
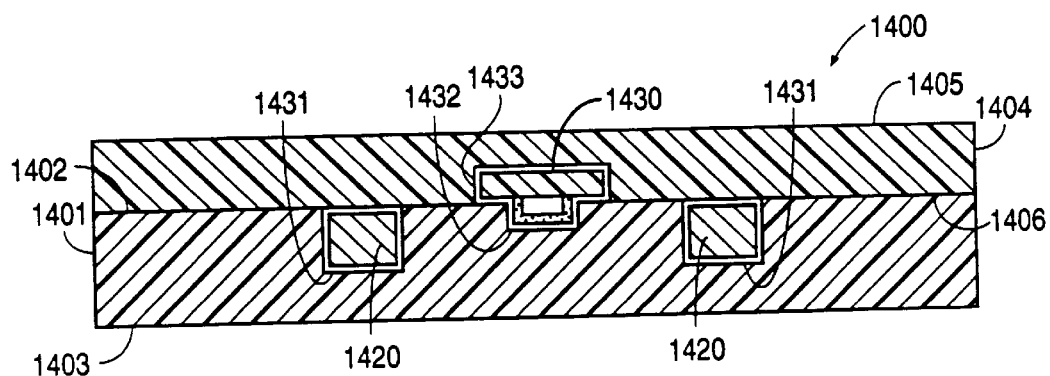

FIG. 14 illustrates a cross section of a reinforcement structure located within a single layer of multiple layer, contact-less card 1400. Reinforcement structure 1420 is disposed in a first opening 1431 in upper surface 1402 of first layer 1401. Module 1430 is partially disposed in a second opening 1432 in upper surface of first layer 1401. A portion of module 1430 is disposed in a third opening 1433 in lower surface 1406 of second layer 1404. The upper surface 1402 and lower surface 1406 are affixed to one another using one of the methods previously described. Second opening 1432 and third opening 1433 are created in first and second layers 1401, 1404, with proper alignment, prior to assembly.

Figure 15:
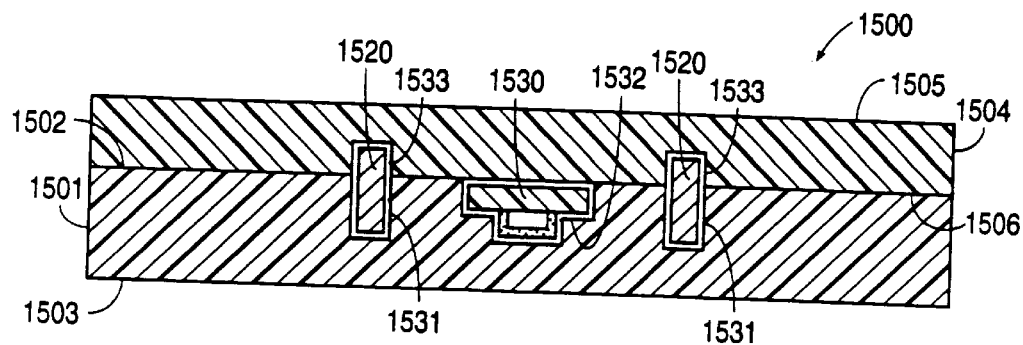

FIG. 15 illustrates a cross section of a reinforcement structure which extends through multiple layers of contact-less card 1500. Reinforcement structure 1520 is disposed in a first opening 1531 in upper surface 1502 of first layer 1501. Module 1530 is disposed in a second opening 1532 in upper surface of first layer 1501. Reinforcement structure 1520 is also disposed in a third opening 1533 in lower surface 1506 of second layer 1504. The upper surface 1502 and lower surface 1506 are affixed to one another using one of the methods previously described. First opening 1531 and third opening 1533 are created in first and second layers 1501, 1504, respectively, with proper alignment prior to assembly.

Figure 16:
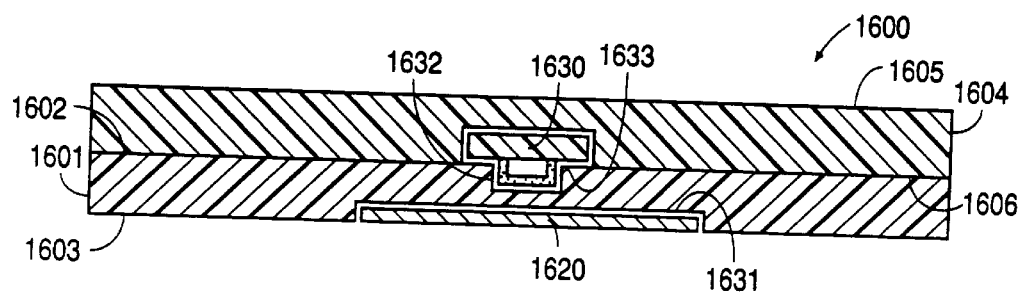

FIG. 16 illustrates a cross section of a reinforcement structure located within a single layer of multiple layer, contact-less card 1600. Reinforcement structure 1620 is disposed in a first opening 1631 in lower surface 1603 of first layer 1601. A first portion of module 1630 is disposed in a second opening 1632 in upper surface 1602 of first layer 1601. Another portion of module 1630 is disposed in a third opening 1633 in lower surface 1606 of second layer 1604. Upper surface 1602 and lower surface 1606 are affixed to one another using one of the methods previously described. Second opening 1632 and third opening 1633 are created in first and second layers 1601, 1604, with proper alignment, prior to assembly. The reinforcement structure of this embodiment is not limited to plate-type reinforcement structure 1620, but also includes washer-type and cap-type reinforcement structures.

Figure 17:
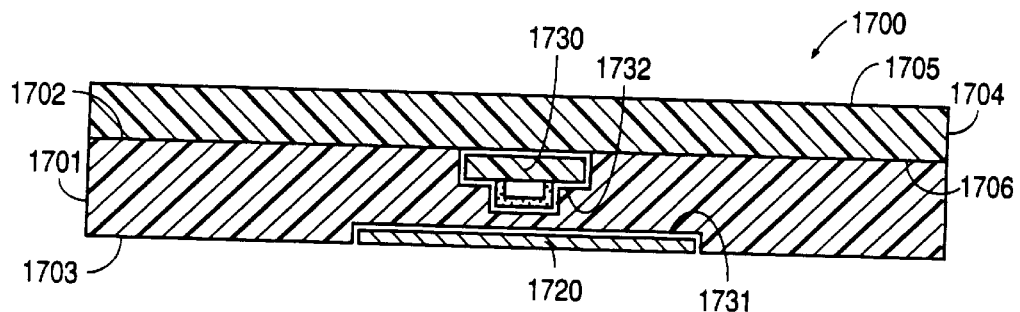

FIG. 17 is cross section of a contact-less card 1700 in accordance with the present invention. As shown in FIG. 17, a reinforcement structure 1720, is affixed in first opening 1731 in the lower surface 1703 of first layer 1701. Module 1730 is similarly affixed in second opening 1732 in the upper surface 1702. Lower surface 1706 of second layer 1704 is bonded to the upper surface 1702 of first layer 1701 using one of the bonding methods previously described. The reinforcement structure of this embodiment is not limited to plate-type reinforcement structure 1720, but also includes washer-type and cap-type reinforcement structures.

FIGS. 18–21 illustrate two-layer embodiments which may be used for contact-type cards.

Figure 18:
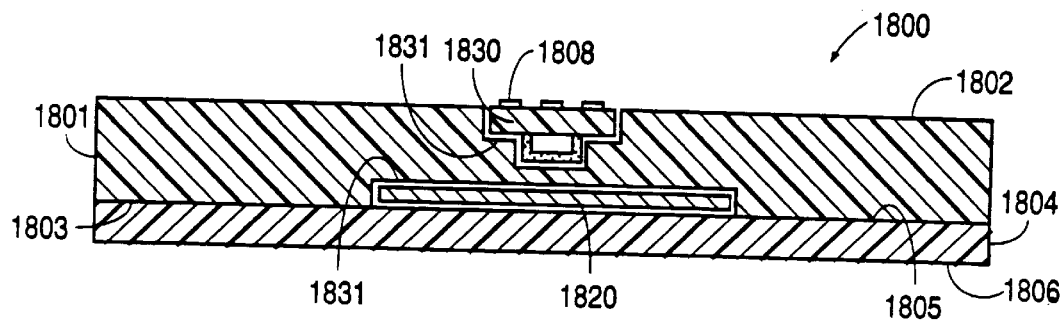
FIGS. 18–21 are cross sections of different embodiments of two layer contact-type cards, each card having a reinforcement structure.

FIG. 18 is cross section of a contact type card 1800 in accordance with the present invention. Reinforcement structure 1820, is affixed in first opening 1831 in the lower surface 1803 of first layer 1801. Module 1830 is affixed in second opening 1832 in the upper surface 1802 of first layer 1801. Contacts, such as contact 1808 of module 1830, are exposed at the upper surface 1802 of first layer 1801. Lower surface 1803 of first layer 1801 is bonded to the upper surface 1805 of second layer 1804 using one of the methods previously described to form a laminated structure. The reinforcement structure of this embodiment is not limited to plate-type reinforcement structure 1820, but also includes washer-type and cap-type reinforcement structures.

Figure 19:
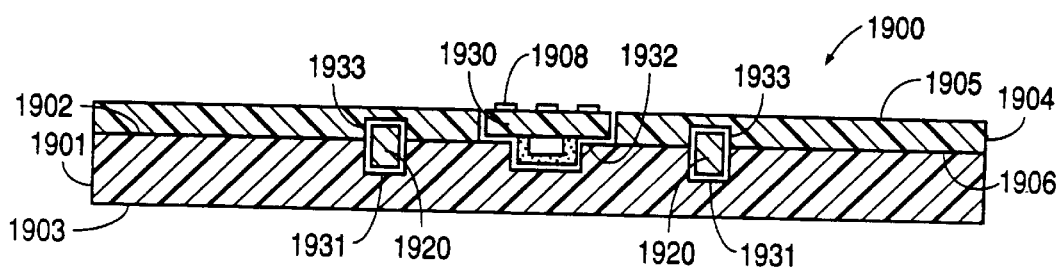

FIG. 19 illustrates a cross section of a reinforcement structure which extends through multiple layers of contact type card 1900. Reinforcement structure 1920 is disposed in a first opening 1931 in upper surface 1902 of first layer 1901. Reinforcement structure 1920 is also disposed in a third opening 1933 in lower surface 1906 of second layer 1904. Module 1930 is disposed in a second opening 1932 which extends through second layer 1904 and into upper surface 1902 of first layer 1901. Contacts, such as contact 1908 of module 1930, are exposed at the upper surface 1905 of second layer 1904. Lower surface 1906 of second layer 1904 is bonded to the upper surface 1902 of first layer 1901 using one of the methods previously described to form a laminated structure.

Figure 20:
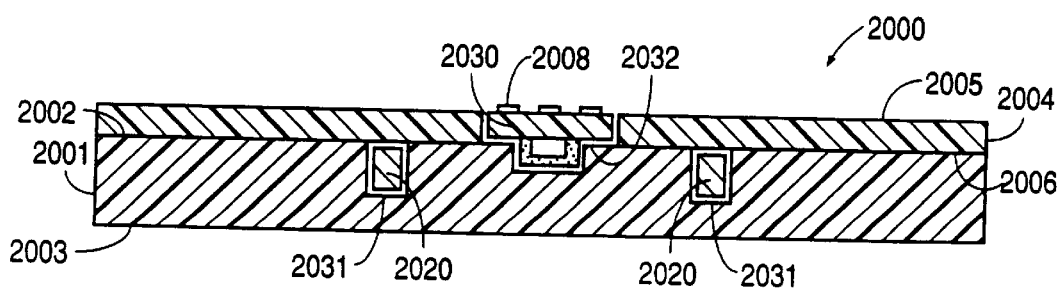

FIG. 20 illustrates a cross section of a reinforcement structure which is contained within a single layer of contact type card 2000. Reinforcement structure 2020 is disposed in a first opening 2031 in upper surface 2002 of first layer 2001. Module 2030 is disposed in a second opening 2032 which extends through second layer 2004 and into upper surface 2002 of first layer 2001. Contacts, such as contact 2008 of module 2030, are exposed at the upper surface 2005 of second layer 2004. Lower surface 2006 of second layer 2004 is bonded to the upper surface 2002 of first layer 2001 using one of the methods previously described to form a laminated structure.

Figure 21:
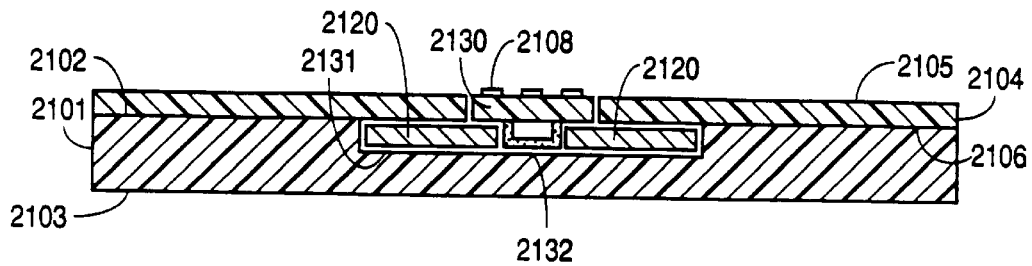
Figure 22:
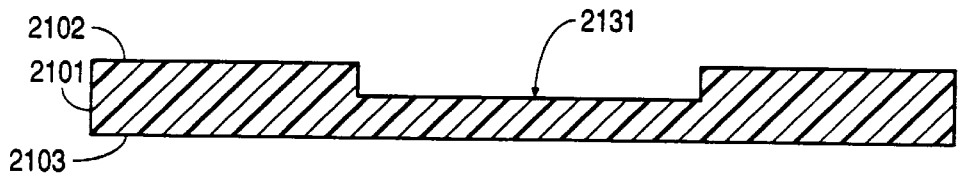
FIGS. 22–24 are cross sections illustrating the steps used to create the card of FIG. 21.
Figure 23:
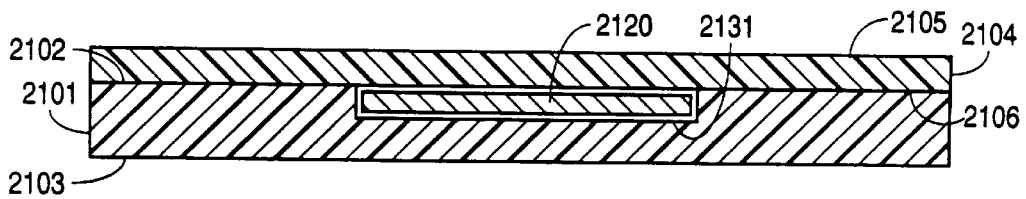
Figure 24:
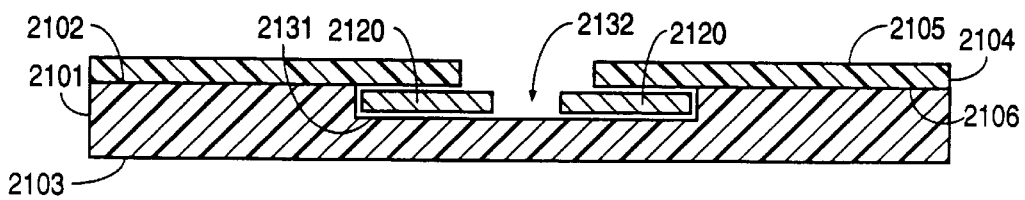

FIG. 21 illustrates an alternate embodiment of the structure of FIG. 20, substituting a plate-type reinforcement structure for the washer-type reinforcement structure. FIGS. 22–24 illustrate the steps used to create the structure of FIG. 21. First opening 2131 (FIG. 22) is formed in the upper surface 2102 of first layer 2101 by punching, milling, machining or etching first layer 2101. First opening 2131 is dimensioned to receive plate-type reinforcement structure 2120. Reinforcement structure 2120, is affixed in opening 2131 with an adhesive or by a method previously described (FIG. 23). Second layer 2104 is then bonded to first layer 2101. Second opening 2132 is then formed by punching, milling, machining or etching through second layer 2104 and plate 2120. In an alternate embodiment, second opening 2132 may extend into first layer 2101. Module 2130 is affixed in opening 2132 using an adhesive (or another method as previously described), resulting in the structure of FIG. 21. Contacts, such as contact 2108 of module 2130, are exposed at the upper surface 2105 of second layer 2104.

Alternately, the card of FIG. 21 may be constructed by using a reinforcement structure and second layer which have pre-formed openings such that the second opening is formed when the first layer and second layer are bonded together.

Figure 25:
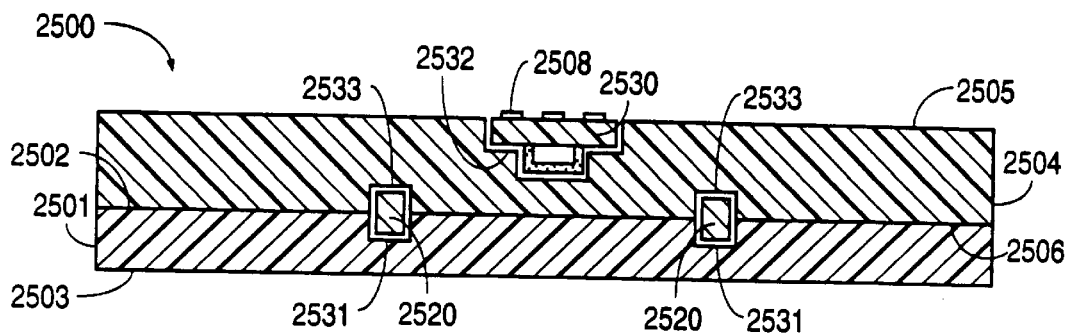
FIGS. 25–28 are cross sections of different embodiments of two layer contact-type cards, each card having a reinforcement structure.

FIG. 25 illustrates a cross section of a reinforcement structure which extends through multiple layers of contact type card 2500. Reinforcement structure 2520 is disposed in a first opening 2531 in upper surface 2502 of first layer 2501. Reinforcement structure 2520 is also disposed in a third opening 2533 which extends into the lower surface 2506 of second layer 2504. Lower surface 2506 of second layer 2504 is bonded to the upper surface 2502 of first layer 2501 using one of the methods previously described. Module 2530 is disposed in second opening 2532 in upper surface 2505 of second layer 2504. Contacts, such as contact 2508 of module 2530, are exposed at the upper surface 2505 of second layer 2504.

Figure 26:
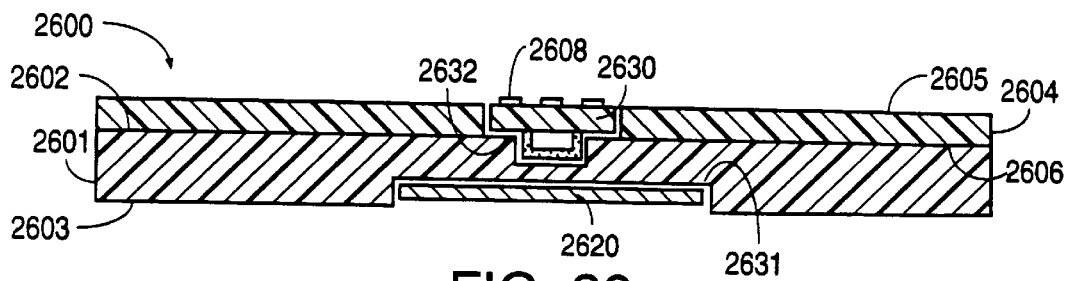

FIG. 26 illustrates a cross section of a reinforcement structure which is contained within a single layer of contact type card 2600. Reinforcement structure 2620 is disposed in a first opening 2631 in lower surface 2603 of first layer 2601. Module 2630 is disposed in a second opening 2632 which extends through second layer 2604 and into upper surface 2602 of first layer 2601. Contacts, such as contact 2608 of module 2630, are exposed at the upper surface 2605 of second layer 2604. Lower surface 2606 of second layer 2604 is bonded to the upper surface 2602 of first layer 2601 using one of the methods previously described to form a laminated structure. The reinforcement structure of this embodiment is not limited to plate-type reinforcement structure 2620, but also includes washer-type and cap-type reinforcement structures.

Figure 27:
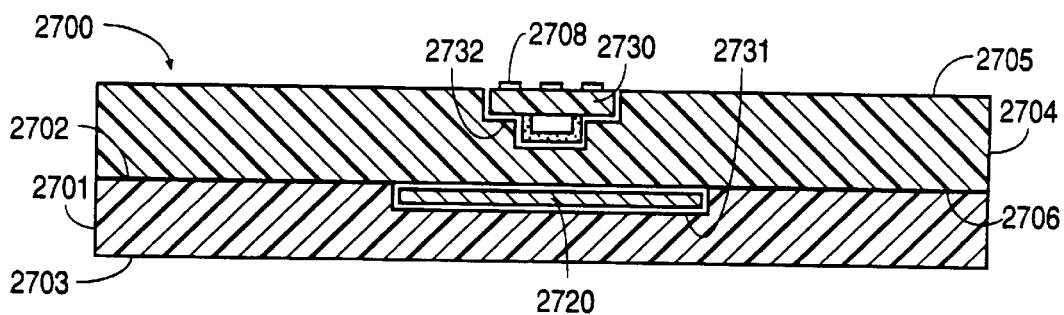

FIG. 27 illustrates a cross section of a reinforcement structure which is contained within a single layer of contact type card 2700. Reinforcement structure 2720 is disposed in a first opening 2731 in upper surface 2702 of first layer 2701. Module 2730 is disposed in a second opening 2732 in the upper surface 2705 of second layer 2704. Contacts, such as contact 2708 of module 2730, are exposed at the upper surface 2705 of second layer 2704. Lower surface 2706 of second layer 2704 is bonded to the upper surface 2702 of first layer 2701 using one of the methods previously described to form a laminated structure. The reinforcement structure of this embodiment is not limited to plate-type reinforcement structure 2720, but also includes washer-type and cap-type reinforcement structures.

Figure 28:
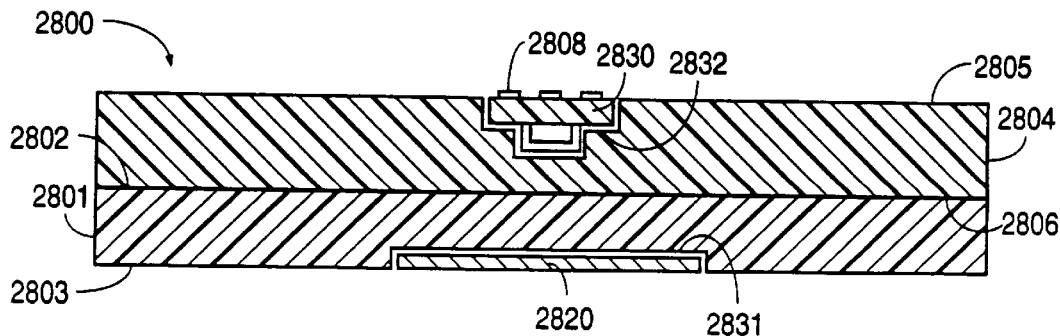

FIG. 28 illustrates a cross section of a reinforcement structure which is contained within a single layer of contact type card 2800. Reinforcement structure 2820 is disposed in a first opening 2831 in lower surface 2803 of first layer 2801. Module 2830 is disposed in a second opening 2832 in the upper surface 2805 of second layer 2804. Contacts, such as-contact 2808 of module 2830, are exposed at the upper surface 2805 of second layer 2804. Lower surface 2806 of second layer 2804 is bonded to the upper surface 2802 of first layer 2801 using one of the methods previously described to form a laminated structure. The reinforcement structure of this embodiment is not limited to plate-type reinforcement structure 2820, but also includes washer-type and cap-type reinforcement structures.

Figure 29:
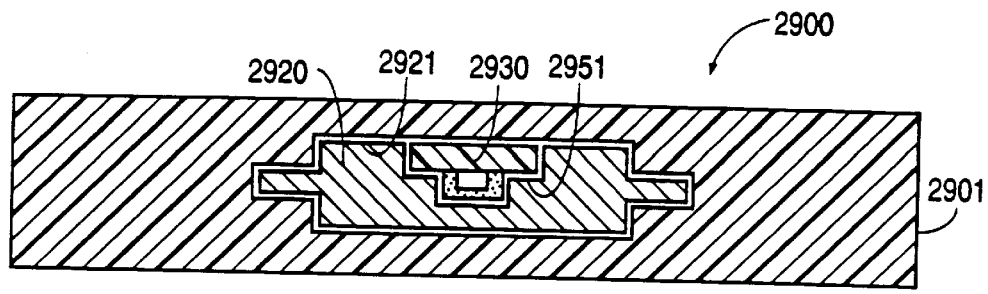
FIGS. 29–31 are cross sections of contact-less cards having a reinforcement structure which receives a module.
Figure 30:
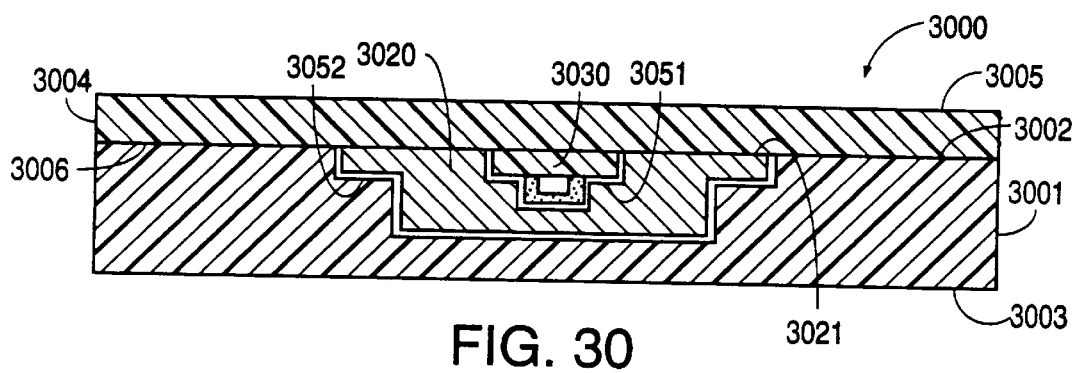
Figure 31:
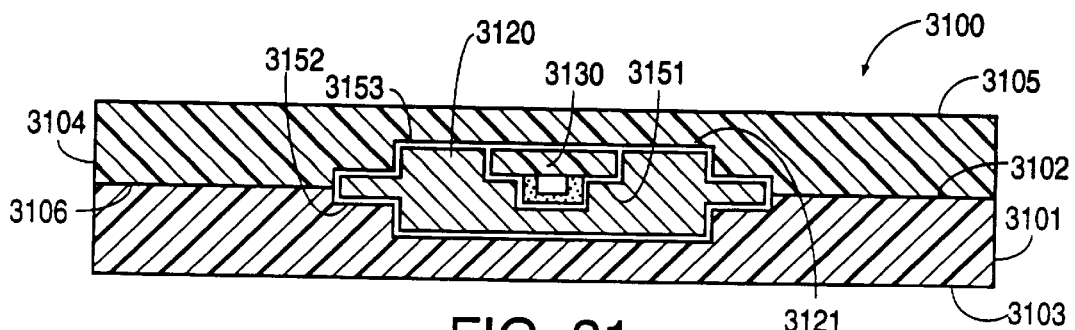

In an alternate embodiment of the present invention, the module to be protected is disposed directly into a reinforcement structure. FIGS. 29–31 are cross sections of contactless cards which utilize such a reinforcement structure.

FIG. 29 is cross section of a molded single layer contactless card 2900 in accordance with the present invention. As shown in FIG. 29, a module 2930 is affixed in a first opening 2951 in upper surface 2921 of reinforcement structure 2920. Module 2930 and reinforcement structure 2920 are molded within a single layer 2901 of card 2900 using the method previously described in connection with the molded card embodiment shown in FIG. 11.

FIG. 30 is a cross section of a two layer contact-less card 3000 having a reinforcement structure located within a single layer. Module 3030 is affixed in a first opening 3051 in upper surface 3021 of reinforcement structure 3020. Reinforcement structure 3020 is affixed in second opening 3052 in the upper surface 3002 of first layer 3001. The bottom surface 3006 of second layer 3004 is affixed to the upper surface 3021 of reinforcement structure 3020 and to the upper surface 3002 of first layer 3001.

FIG. 31 is a cross section of a two layer contact-less card 3100 having a reinforcement structure located in both layers. Module 3130 is affixed in a first opening 3151 in upper surface 3121 of reinforcement structure 3120. Reinforcement structure 3120 is affixed in second opening 3152 in the upper surface 3102 of first layer 3101. A third opening 3153 in the bottom surface 3106 of second layer 3104 receives the reinforcement structure 3120. Bottom surface 3106 of second layer 3104 is affixed to the upper surface 3121 of reinforcement structure 3120 and to the upper surface 3102 of first layer 3101.

Figure 32:
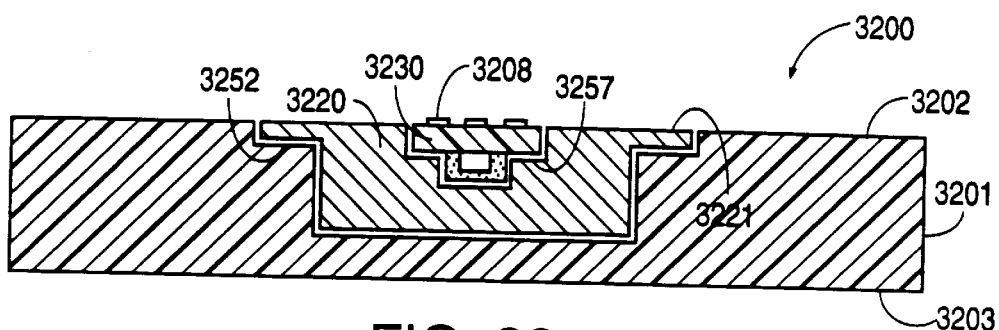
FIGS. 32–34 are cross sections of contact-type cards having a reinforcement structure which receives a module.
Figure 33:
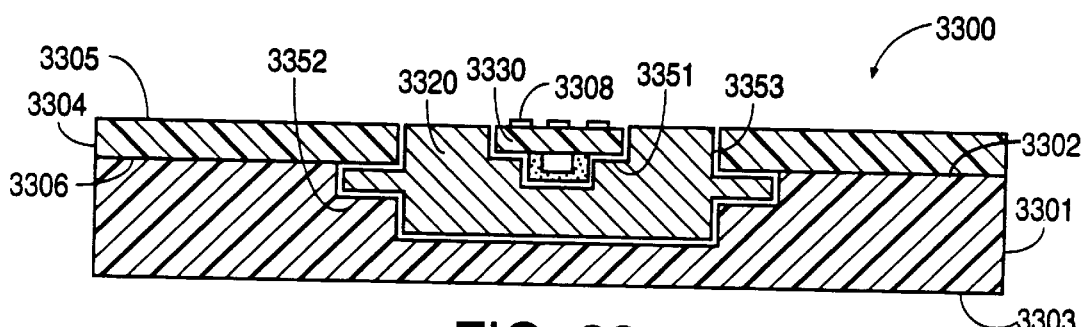
Figure 34:
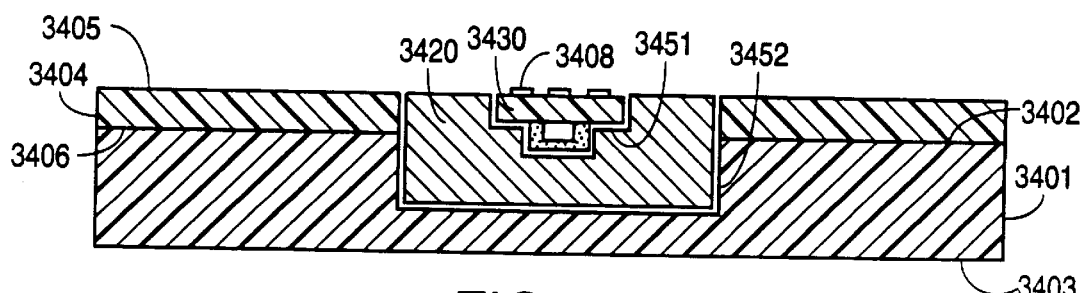
Figure 35:
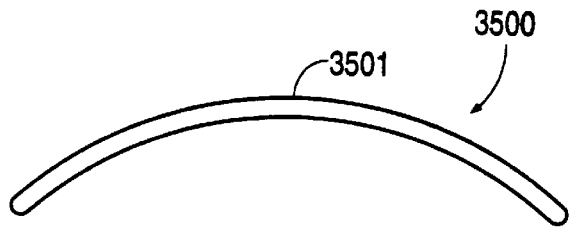
FIG. 35 is a cross section of a card which is being bent.

FIGS. 32–34 are cross sections of contact-type cards which utilize a reinforcement structure which directly receives the module.

FIG. 32 is a cross section of a single layer contact-type card 3200 having a reinforcement structure which directly receives a module. Module 3230 is affixed in a first opening 3251 in upper surface 3221 of reinforcement structure 3220. Reinforcement structure 3220 is affixed in second opening 3252 in the upper surface 3202 of first layer 3201. Contacts, such as contact 3208 of module 3230, are exposed at the upper surface 3202 of first layer 3201.

FIG. 33 is a cross section of a two layer contact-type card 3300 having a reinforcement structure located in both layers. Module 3330 is affixed in a first opening 3351 in upper surface 3321 of reinforcement structure 3320. Reinforcement structure 3320 is affixed in second opening 3352 in the upper surface 3302 of first layer 3301. Reinforcement structure 3320 extends through a third opening 3353 in second layer 3304 such that contacts, such as contact 3308, are exposed at upper surface 3305 of second layer 3304. Bottom surface 3306 of second layer 3304 is affixed to the upper surface 3302 of first layer 3301.

FIG. 34 is a cross section of another two layer contact-type card 3400 having a reinforcement structure located in both layers. Module 3430 is affixed in a first opening 3451 in upper surface 3421 of reinforcement structure 3420. Bottom surface 3406 of second layer 3404 is affixed to the upper surface 3402 of first layer 3401. Reinforcement structure 3420 is affixed in second opening 3452 which extends through second layer 3404, the upper surface 3402 of first layer 3401 and part of first layer 3401. Contacts, such as contact 3408, are exposed at the upper surface 3402 of second layer 3404.

The position of the reinforcement structure/module pair may be determined by ISO standard or by the card designer. It should be noted that the torque at any point on a card is inversely proportional to the radius of curvature at that point. In card 3500 illustrated in FIG. 35, the smallest radius, and hence the largest torque, occurs at mid-point 3501. Thus, to further reduce stress on the module, in certain embodiments it may be desirable to locate the reinforcement structure/module pair(s) away from the mid-point 3501 of the card. In other embodiments, the reinforcement structure may allow the module to be located closer to the mid-point 3501 than it could be in the absence of the reinforcement structure.

Figure 36:
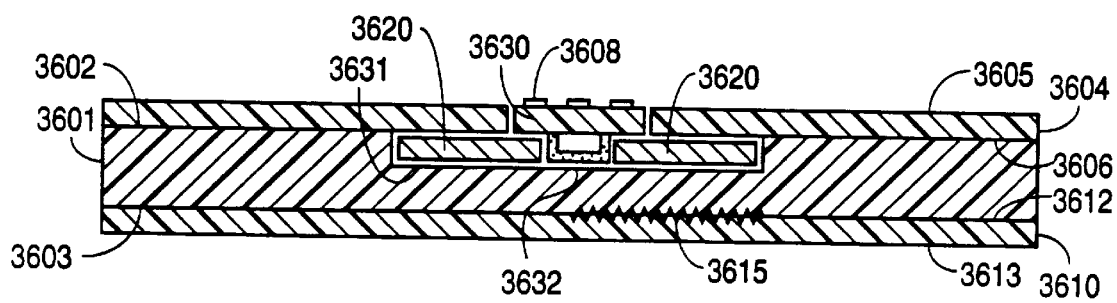
FIG. 36 is a cross section of a contact-type card having a structure similar to the card of FIG. 21, in which an additional layer is added.

In alternate embodiments of the present invention, additional layers may be added to the card. FIG. 36 illustrates an embodiment in which an additional layer is added to a card similar to the card illustrated in FIG. 21. The upper surface 3612 of third layer 3610 is affixed to the lower surface 3603 of the first layer 3601. Third layer 3610 is a clear plastic such as PVC, PET or polycarbonate, thereby allowing artwork 3615, such as advertising or instructions to be placed either the upper surface 3612 of third layer 3610 or the lower surface 3603 of first layer 3601. Because first layer 3601 is bonded to third layer 3610, the artwork 3615 is protected from scratching.

Figure 37:
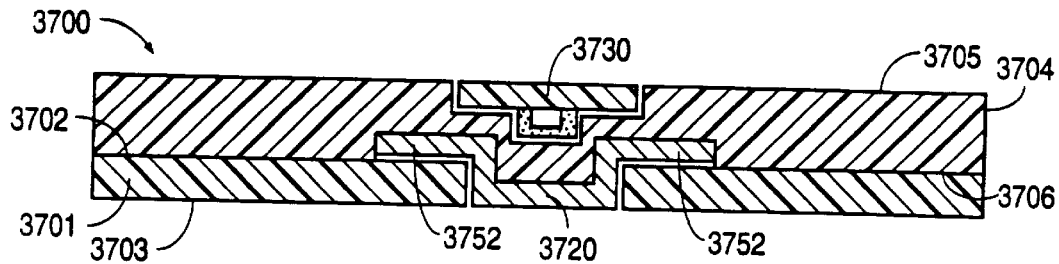
FIG. 37 is a cross section of a card according to an alternate embodiment of the present invention.
Figure 38A:
FIGS. 38a–d are cross sections illustrating a method for fabricating the card of FIG. 37.
Figure 38B:
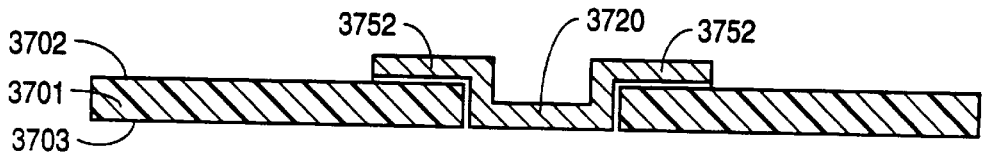
Figure 38C:
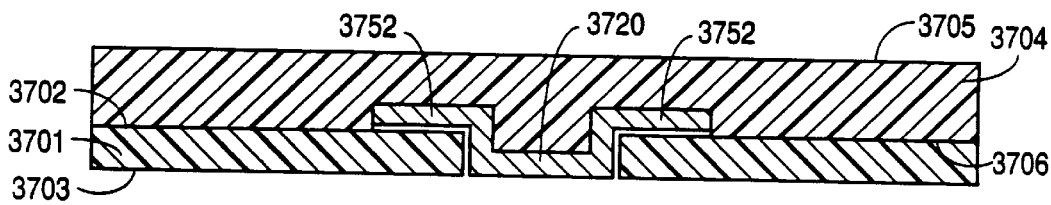
Figure 38D:
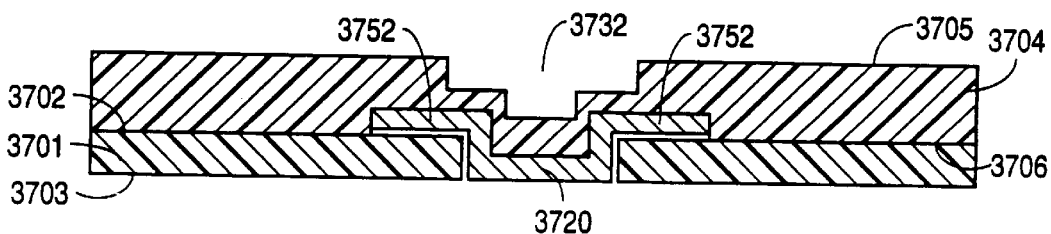

FIG. 37 is a cross section of a card 3700 according to an alternate embodiment of the present invention. FIGS. 38*a*–*d* are cross sections illustrating a method for fabricating card 3700 of FIG. 37. As illustrated in FIG. 38*a*, a first opening 3731 is created in first layer 3701. In the illustrated embodiment, first opening 3731 extends completely through first layer 3701. However, in other embodiments, first opening 3731 does not extend completely through first layer 3701. Cap type reinforcement structure 3720 is similar to the reinforcement structures illustrated in FIGS. 7*a*–*d*; however, cap type reinforcement structure 3720 includes a flange portion 3752 which extends away from the rest of the reinforcement structure. Cap type reinforcement structure 3720 is inserted into the first opening 3731 such that the flange 3752 of reinforcement structure 3720 rests on the upper surface 3702 of first layer 3701 (FIG. 38*b*). Reinforcement structure 3720 can be affixed to first layer 3701 at the interface between the flange 3752 and the upper surface 3702 of the first layer 3701 using and adhesive or another suitable method. In another embodiment, reinforcement structure 3720 is not affixed to the first layer 3701 in the manner previously described. Instead, second layer 3704 is built up by adding one or more layers over the upper surface 3702 of first layer 3701 and reinforcement structure 3720 (FIG. 38*c*). Second layer 3704 is created by heat laminating additional layers of material onto first layer 3701 and reinforcement structure 3720. FIG. 38*c* illustrates the resulting structure, with reinforcement structure 3720 held between first layer 3701 and second layer 3704. As illustrated in FIG. 38*d*, a second opening 3732 is formed in the upper surface 3705 of second layer 3704. Module 3730 is then affixed in second opening 3732 using a method previously described.

Figure 39:
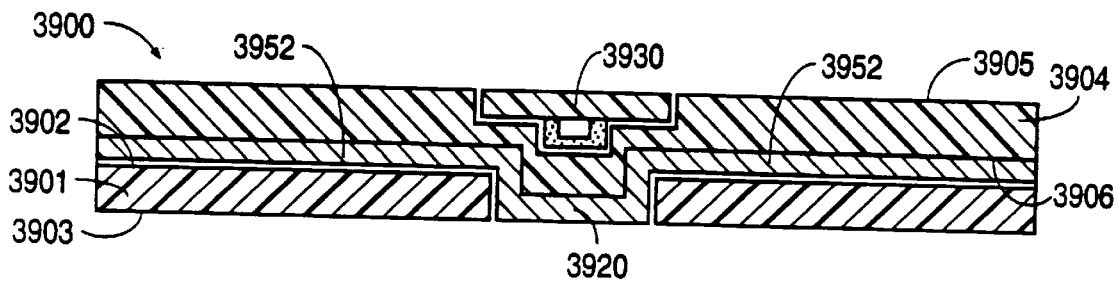
FIGS. 39 and 40 are cross sections of cards which illustrate alternate embodiments of the card of FIG. 37.
Figure 40:
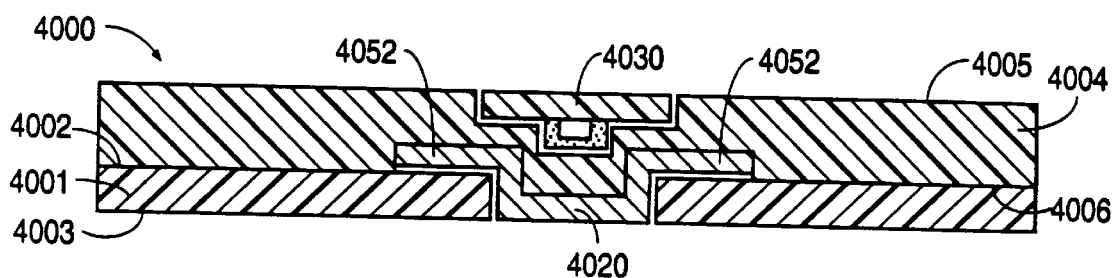

Variations of the embodiment illustrated in FIG. 37 are shown in FIGS. 39 and 40. FIG. 39 is a cross section of a card 3900 having a reinforcement structure 3920 with a flange 3952 which extends to the edges of card 3900. FIG. 40 is a cross section of a card 4000 having a reinforcement structure 4052 which is positioned closer to the upper surface 4005 of second layer 4004.

Figure 41:
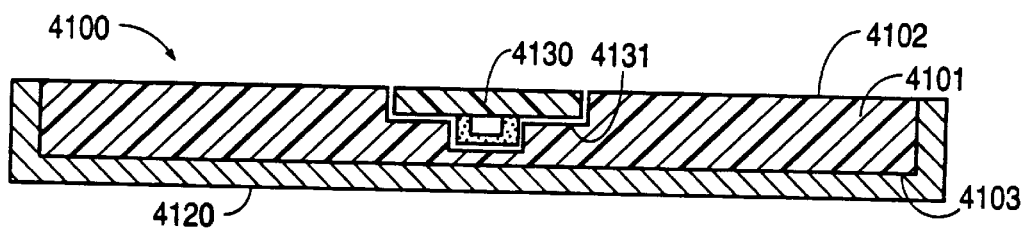
FIGS. 41 and 42 are cross sections of cards according to alternate embodiments of the present invention.

FIG. 41 is a cross section of a card 4100 according to an alternate embodiment of the present invention. Reinforcement structure 4120 is a cap type reinforcement structure which surrounds first layer 4101, except for the upper surface 4102 of first layer 4101. In one embodiment, card 4100 is fabricated by affixing reinforcement structure 4120 onto first layer 4101 using a method previously described. In another embodiment, card 4100 is fabricated by molding first layer 4101 within reinforcement structure 4120. A first opening 4131 is created in the upper surface 4102 of first layer 4101. Module 4130 is affixed in first opening 4131. Reinforcement structure 4120 can be made of materials such as metals, graphite reinforced materials and plastics.

Figure 42:
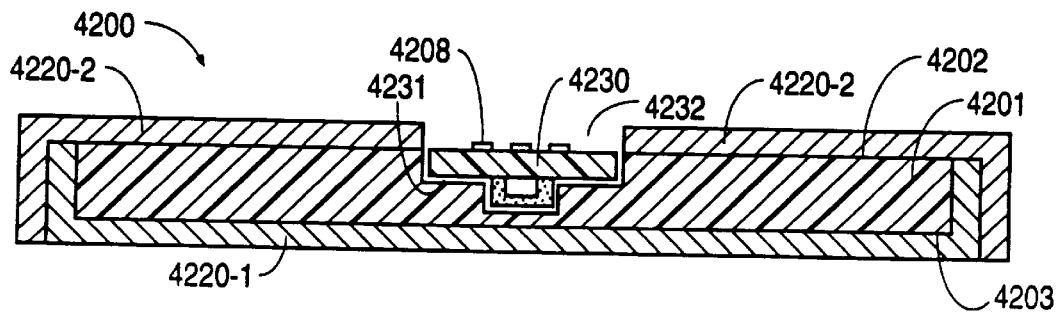

FIG. 42 is a cross section of a card 4200 according to an alternate embodiment of the present invention. Reinforcement structure 4220-1 is a cap type reinforcement structure which surrounds first layer 4201, except for the upper surface 4202 of first layer 4201. The reinforcement structure 4220-1 and first layer 4201 are created using one of the methods previously described in connection with card 4100 (FIG. 41). A first opening 4231 is created in the upper surface 4202 of first layer 4201. Module 4230 is affixed in first opening 4131. A second cap type reinforcement structure 4220-2 is positioned over reinforcement structure 4220-2. Reinforcement structure 4220-2 can be held on reinforcement structure 4220-1 in various ways which include the use of an adhesive or an interference fit. An opening, such as opening 4232, is provided in reinforcement structure 4120-1 to allow access to contacts, such as contact 4208, on module 4130. In a contact less embodiment, opening 4232 is omitted. Reinforcement structures 4220-1 and 4220-2 can be made of materials such as metals, graphite reinforced materials and plastics.

Although the present invention has been described in connection with several embodiments, variations of these embodiments will be obvious to one of ordinary skill in the art. For example, an additional layer may be affixed over the contact-type structures to create a contact-less structure. Additional layers may be added to create cards having more than two layers. Furthermore, the present invention can be used in flexible cards having dimensions other than the dimensions specified by ISO standards. Accordingly, the present invention is limited only by the claims as set forth below.

What is claimed is:

1. A semi-rigid card comprising, a semi-rigid body having a first surface and a second surface located opposite the first surface, the semi-rigid body having a first modulus of elasticity, a module having an electronic component, said module disposed in said semi-rigid body, and a reinforcement structure having a second modulus of elasticity, said second modulus of elasticity being higher than said first modulus of elasticity, said reinforcement structure separated from said module and completely surrounded by said semi-rigid body between said first surface and said second surface.

2. The semi-rigid card of claim 1, wherein said module has contacts which are exposed at the first surface of said semi-rigid body.

3. The semi-rigid card of claim 1, wherein the reinforcement structure laterally surrounds the module.

4. The semi-rigid card of claim 3, wherein the reinforcement structure comprises a washer.

5. The semi-rigid card of claim 1, wherein the reinforcement structure comprises a planar plate.

6. The semi-rigid card of claim 1, wherein said module is completely surrounded by said semi-rigid body.

7. The semi-rigid card of claim 6, wherein said semi-rigid body is a unitary structure.

8. The semi-rigid card of claim 1, wherein said semi-rigid body comprises a plurality of semi-rigid layers.

9. The semi-rigid card of claim 8, wherein said module extends into more than one of the plurality of semi-rigid layers.

10. The semi-rigid card of claim 8, wherein the reinforcement structure extends into more than one of the plurality of semi-rigid layers.

11. A method of making a semi-rigid card, the method comprising the steps of:

disposing a reinforcement structure in a semi-rigid body such that the reinforcement structure is completely surrounded by the semi-rigid body, the semi-rigid body having a first modulus of elasticity and the reinforcement structure having a second modulus of elasticity, the second modulus of elasticity being higher than the first modulus of elasticity; and disposing a module having an electronic component in the semi-rigid body, said module separated from said reinforcement structure.

12. The semi-rigid card of claim 1, wherein said reinforcement structure is polygonal or round.

13. The method of claim 11, wherein said reinforcement structure is polygonal or round.

* * * * *